United States Patent [19]

Mizuno et al.

[11] Patent Number: 4,894,419
[45] Date of Patent: Jan. 16, 1990

[54] BIAXIALLY-STRETCHED FILM MADE OF POLY(ARYLENE SULFIDE) RESIN COMPOSITION AND PRODUCTION PROCESS THEREOF

[75] Inventors: Toshiya Mizuno; Yoshikichi Teramoto; Takeshi Saito, all of Tsuchiura; Juichi Wakabayashi, Tamari, all of Japan

[73] Assignee: Kureha Kagaku Kogyo K.K., Tokyo, Japan

[21] Appl. No.: 191,131

[22] Filed: May 6, 1988

[30] Foreign Application Priority Data

May 15, 1987 [JP] Japan .................... 62-116777
Mar. 23, 1988 [JP] Japan .................... 63-67272

[51] Int. Cl.$^4$ .................... C08L 81/06; B29D 7/26
[52] U.S. Cl. .................... 525/189; 264/290.2; 525/537
[58] Field of Search .................... 525/189

[56] References Cited

U.S. PATENT DOCUMENTS

| | | |
|---|---|---|
| 3,354,129 | 11/1967 | Edmonds, Jr. et al. . |
| 4,476,284 | 10/1984 | Cleary .................... 525/189 |
| 4,514,588 | 4/1985 | Beever et al. .................... 525/189 |
| 4,613,654 | 9/1986 | Katto et al. .................... 528/388 |
| 4,645,826 | 2/1987 | Iizuka et al. . |
| 4,748,169 | 5/1988 | Izutsu et al. .................... 525/189 |
| 4,769,190 | 9/1988 | Utsumi et al. .................... 264/22 |
| 4,785,057 | 11/1988 | Shiiki et al. .................... 525/535 |

FOREIGN PATENT DOCUMENTS

| | | |
|---|---|---|
| 166451 | 1/1986 | European Pat. Off. . |
| 244093 | 11/1987 | European Pat. Off. . |
| 13469 | 5/1978 | Japan . |
| 3368 | 2/1979 | Japan . |
| 142275 | 11/1979 | Japan . |
| 5101 | 2/1984 | Japan . |
| 7332 | 1/1986 | Japan . |
| 14228 | 1/1986 | Japan . |
| 232442 | 10/1987 | Japan . |

Primary Examiner—Lewis T. Jacobs
Assistant Examiner—David W. Woodward
Attorney, Agent, or Firm—Lowe, Price, LeBlanc, Becker & Shur

[57] ABSTRACT

A biaxially-stretched film is made of a resin composition composed of 100 parts by weight of a substantially linear poly(arylene sulfide) having a melt viscosity of at least 1,000 poises and 0.5–80 parts by weight of a styrene-based resin. The film is produced by diluting a master batch, which has been prepared in advance and is composed of the poly(arylene sulfide) and styrene-based resin, with an additional supply of the poly(arylene sulfide) so as to prepare a resin composition containing the polystyrene-based resin in an amount of 0.5–80 parts by weight per 100 parts by weight of the poly(arylene sulfide), and then biaxially stretching the thus-prepared resin composition.

6 Claims, 2 Drawing Sheets

FIG. I

BIAXIALLY-STRETCHED FILM MADE OF POLY(ARYLENE SULFIDE) RESIN COMPOSITION AND PRODUCTION PROCESS THEREOF

FIELD OF THE INVENTION

This invention relates to a biaxially-stretched film made of a poly(arylene sulfide) resin composition, and more specifically to a biaxially-stretched film having high lubricity and excellent dielectric strength characteristics and obtained by biaxially stretching a resin composition of a substantially linear, high molecular weight poly(arylene sulfide) having a melt viscosity of at least 1,000 poises and a styrene-based resin, and also to a production method thereof. The film is useful, especially, as a capacitor film.

BACKGROUND OF THE INVENTION

It has been known to form poly(arylene sulfides) represented by poly(p-phenylene sulfide) into biaxially-stretched films. Incidentally, the friction coefficient, namely, slip properties between plastic films themselves or between a plastic film and another material generally give significant influence to the efficiency of work when the plastic films or film is processed. When surface coating, printing or wrapping is performed using a film having poor slip properties, a large tensile force is applied to the film so that difficulties are encountered in feeding the film or taking it up into a roll. When the film is employed as a capacitor film in particular, the film is processed through many take-up and rewinding steps in the course of its assembly into a capacitor element. If the slip properties of the film are poor, the film may be torn, stretched and whitened, and/or caused to develop wrinkles. Due to these problems, the film cannot be assembled successfully into a capacitor element or even if it looks as if assembled into a capacitor element, the capacitor element involves one or more fatal defects and cannot be used practically as a capacitor element. On the other hand, unduly good slip properties may also deteriorate the efficiency of work in some instances, including the occurrence of irregular winding by way of example. It is therefore necessary to improve slip properties of a film, in other words, to render the film slidable easily to a certain extent. These easily slidable properties will hereinafter called "high lubricity" for the sake of brevity. For poly(p-phenylene sulfide) films, it is also essential to impart high lubricity from the practical viewpoint. It has heretofore been known to control the surface roughness of a film by adding, as a filler, one or more inert inorganic materials in the form of fine powder, for example, calcium carbonate, silica, alumina, carbon black, glass, calcium phosphate and/or the like (Japanese Patent Publication No. 5101/1984). The addition of such an inorganic filler however results in a reduction in the dielectric strength of a poly(p-phenylene sulfide) film, thereby making the film somewhat insufficient for use as a capacitor film or electrical insulating film in view of the standard of properties required presently for such an application.

The present inventors have already proposed to add poly-4-methylpentene-1 in place of a conventional inorganic filler with a view toward imparting high lublicity to a poly(arylene sulfide) (Japanese Patent application No. 75827/1986). The resultant composition has however been found not to be fully satisfactory in processability such as extrusion stability.

On the other hand, polystyrene films have excellent electrical properties and are used as insulating films, especially, as capacitor films. They however have a drawback that their heat resistance is inferior.

It has also been known to blend a polystyrene-based resin with a poly(arylene sulfide) in order to modify the latter resin, as disclosed in Japanese Patent Publication No. 13469/1978 by way of example. However, the poly(arylene sulfide) employed in the above patent publication is such that could be obtained in accordance with a process disclosed, for example, in Japanese Patent Publication No. 3368/1970, namely, by reacting a polyhalogenated aromatic compound and an alkali metal sulfide at an elevated temperature in a polar organic medium. The poly(arylene sulfide) obtained by such a process has an extremely low polymerization degree and a low melt viscosity, so that it cannot be formed into biaxially-stretched films, to say nothing of its extrusion into films. In addition, the poly(phenylene sulfide) of the low polymerization degree still cannot provide useful films even when it is crosslinked or cured in order to permits its injection. The resin composition described in Japanese Patent Publication No. 13469/1978 has been provided with a view toward improving the moldability and impact resistance of a poly(arylene sulfide) without lowering its tensile property. The resin composition is said to be moldable into articles for various application fields. Its formation into films is however not disclosed there.

It has also been known to blend one or more of various synthetic resins with a poly(arylene sulfide) having a high molecular weight in general. It has however been unknown to form a resin composition, which is composed of a poly(arylene sulfide) and a polystyrene-based resin, into a biaxially-stretched film.

As has been described above, the reduction of dielectric strength characteristics has been unavoidable so long as high lubricity is imparted to a poly(arylene sulfide) film by the addition of an inorganic filler. Furthermore, it has not been known to form a resin composition, which is composed of a poly(arylene sulfide) and a polystyrene-based resin, into a biaxially-stretched film.

SUMMARY OF THE INVENTION

An object of this invention is therefore to provide a poly(arylene sulfide) film which is excellent in heat resistance, has high lubricity and retains dielectric strength characteristics at high levels.

Another object of this invention is to obtain a biaxially-stretched film from a resin composition composed of a substantially linear, high molecular weight poly(arylene sulfide) and a polystyrene-based resin.

The present inventors have carried out an extensive investigation with a view toward solving the above-described drawbacks of the prior art. As a result, it has been found surprisingly that a resin composition formed by blending a polystyrene-based resin with a substantially linear, high molecular weight poly(arylene sulfide) has good film-forming properties, permits biaxial stretching, has high lubricity without need for addition of an inorganic filler and can provide a biaxially-stretched film having superb dielectric strength characteristics, leading to completion of the present invention.

In one aspect of this invention, there is thus provided a biaxially-stretched film made of a poly(arylene sulfide)-based resin composition, wherein the composition comprises 100 parts by weight of a substantially linear poly(arylene sulfide) having a melt viscosity of at least 1,000 poises and 0.5–80 parts by weight of a styrene-based resin.

In another aspect of this invention, there is also provided a process for the production of a biaxially-stretched film made of a poly(arylene sulfide)-based resin composition, which comprises blending an additional supply of a substantially-linear poly(arylene sulfide) having a melt viscosity of at least 1,000 poises with a resin composition prepared in advance and composed of 100 parts by weight of the poly(arylene sulfide) and 10–100 parts of a styrene-based resin, thereby preparing a resin composition containing 0.5–80 parts by weight of the polystyrene-based resin per 100 parts by weight of the poly(arylene sulfide), and then biaxially stretching the latter-mentioned resin composition.

The biaxially-stretched film according to the present invention, which is made of the poly(arylene sulfide)-based resin composition, has excellent advantages that it has high lubricity, superb dielectric strength characteristics and good film-forming properties. It is therefore useful for various applications, in particular, as a capacitor film.

DETAILED DESCRIPTION OF THE INVENTION

Figure 1:
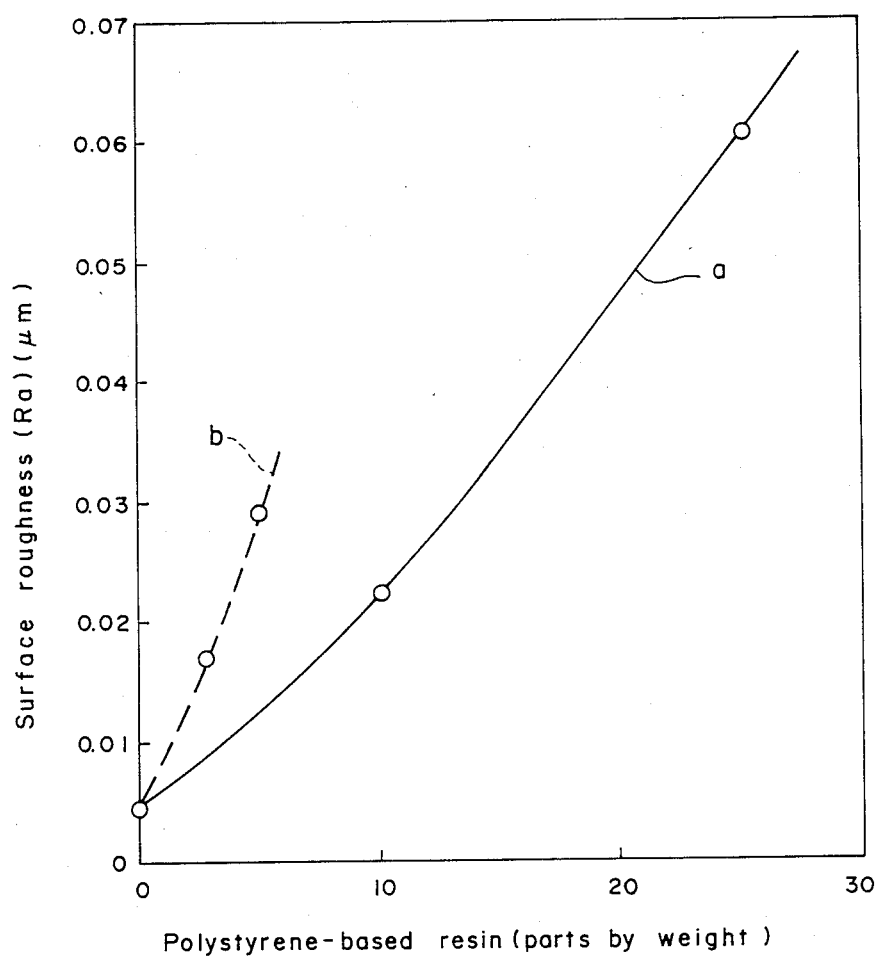
FIG. 1 illustrates diagrammatically the surface roughness levels of films according to the present invention.

Elements of the present invention will hereinafter be described in detail.

Poly(arylene sulfide):

The poly(arylene sulfide) useful in the practice of this invention is a substantially linear, high molecular weight resin having a melt viscosity of at least 1,000 poises (as measured at 310° C. and a shear rate of 200/second), preferably, 2,500–100,000 poises. The term —"substantially linear, high molecular weight poly(arylene sulfide)"—as used herein does not mean a polymer obtained as a result of viscosity increment (curing) through oxidative crosslinking but does mean a polymer obtained from a practically bifunctional monomer alone. The determination whether a poly(arylene sulfide) is such a substantially linear, high molecular weight poly(arylene sulfide) or not is effected on the basis of a standard whether the shear rate dependency of the poly(arylene sulfide) is low in the measurement of its melt viscosity, for example, at 310° C. and the non-Newtonian coefficient (n) is hence close to 1 in an equation expressing the relationship between the shear rate (S) and shear stress (D), namely, $S = \alpha D^n$ in which n and $\alpha$ are both constants. The value (n) of the substantially linear, high molecular weight poly(arylene sulfide) may preferably fall within a range of $1 \leq n < $ about 2 when it is measured at a shear rate of about 200 sec$^{-1}$.

If the melt viscosity is smaller than 1,000 poises, the poly(arylene sulfide) undergoes considerable phase separation when blended with a styrene-based resin, thereby making it difficult to form a uniform composition. Moreover, the resulting composition is inferior in film-forming properties and is thus unable to provide biaxially-stretched films stably.

Such a substantially linear, high molecular weight poly(arylene sulfide) can be produced by a known process. For example, it may be obtained suitably by subjecting an alkali metal sulfide and a dihalogenated aromatic compound to specific two-stage heat-up polymerization in the presence of water in an organic amide solvent such as N-methylpyrrolidone, as described in Japanese Patent Laid-Open No. 7332/1986.

Illustrative examples of the alkali metal sulfide may include lithium sulfide, sodium sulfide, potassium sulfide, rubidium sulfide, cesium sulfide and mixtures thereof.

As exemplary dihalogenated aromatic compounds, may be mentioned p-dichlorobenzene, m-dichlorobenzene, 2,5-dichlorotoluene, p-dibromobenzene, 1,4-dichloronaphthalene, 1-methoxy-2,5-dichlorobenzene, 4,4'-dichlorobiphenyl, 3,5-dichlorobenzoic acid, p,p'-dichlorodiphenyl ether, 3,3'-dichlorodiphenyl sulfone, 3,3'-dichlorodiphenyl sulfoxide and 3,3'-dichlorodiphenyl. They may be used either singly or in combination.

The poly(arylene sulfide) employed in this invention may preferably be a substantially linear poly(p-phenylene sulfide) copolymer, notably, that containing p-phenylene sulfide or m-phenylene sulfide units a little as a component. As such poly(p-phenylene sulfides) and their copolymers, commercial products may be used.

The term "poly(arylene sulfide)" will hereinafter mean a substantially linear, high molecular poly(arylene sulfide) at every occurrence unless otherwise specifically indicated.

Styrene-based resin:

As exemplary styrene-based resins useful in the practice of this invention, may be mentioned polystyrene, high impact polystyrene (HIPS), copolymers of styrene and copolymerizable monomers such as α-methylstyrene, acrylonitrile and vinyltolunene, acrylonitrile-butadiene-styrene resins (ABS resins), etc.

Blending proportions and method:

Regarding the blending proportions of the poly(arylene sulfide) to the styrene-based resin in the present invention, the styrene-based resin may be blended in an amount of 0.5–80 parts by weight, preferably 2–50 parts by weight, most preferably 3–25 parts by weight, all, per 100 parts by weight of the poly(arylene sulfide).

If the blending proportion of the styrene-based resin is extremely small, its effects to impart high lubricity to a film cannot be exhibited fully. In contrast, the use of the styrene-based resin in an extremely large proportion can improve the processability, but lowers the inherent high heat resistance of the poly(arylene sulfide) and cannot improve the lubricity and dielectric strength characteristics any further. It is hence not preferred to blend the styrene-based resin in such an extremely large proportion.

Although no particular limitation is imposed on the blending method, it is generally preferable to blend desired amounts of poly(arylene sulfide) powder with styrene-based resin powder in a molten state and then to form the resultant melt into pellets. The styrene-based resin is unstable, for example, the resin foams, at the processing temperature of the poly(arylene sulfide), for example, 300–350° C. when it is processed alone. Their blend however permits stable processing contrary to what is expected. These pellets are supplied to the next step, namely, the film-forming step. It should however be noted that when a master batch is prepared in advance by blending the styrene-based resin in an amount somewhat greater than the predetermined level with a relatively small amount of the poly(arylene sulfide) and is then diluted with the poly(arylene sulfide), the resulting composition can provide a biaxially-stretched film having a surface roughness greater than that obtained from a simple blend of both resins. In other words, the application of such a master batch method allows to impart high lubricity by using the styrene-based resin in a smaller proportion. It is preferable for the master batch to contain 10–100 parts by weight of the styrene-based resin per 100 parts by weight of the poly(arylene sulfide). The master batch is then diluted with the same poly(arylene sulfide) to prepare a resin composition in which the styrene-based resin is contained in the predetermined proportion, namely, within the proportion of 0.5–80 parts by weight per 100 parts by weight of the poly(arylene sulfide).

Incidentally, one or more of various fillers, pigments and the like may also be added to such extents that the objects of the present invention are not impaired.

Biaxial stretching method:

The resin composition of the poly(arylene sulfide) and styrene-based resin is then subjected to biaxial stretching and thermal setting in accordance with a usual melt film-forming method. Namely, the resin composition is extruded in a molten state into a sheet or press-formed, followed by quenching into an amorphous film. Thereafter, it is biaxially stretched by a suitable method such as drawing or rolling. The biaxial stretching method may be either simultaneous biaxial stretching method or sequential biaxial stretching method. The stretching temperature may range from 80° C. to 120° C. The draw ratio may be at least 4 times, preferably, at least 6 times in terms of area draw ratio. In addition, the thermal setting temperature may preferably be in a range of 200–280° C.

The thickness of the biaxially-stretched film may be chosen suitably from a small thickness to a large thickness depending on its application purpose and no particular limitation is imposed thereon. However, it may generally range from about 1 μm to about 150 μm. The thickness varies depending on the application field. It may preferably be 1–20 μm as a capacitor film and 15–125 μm as a flexible printed circuit board.

In general, the biaxial stretching of the poly(arylene sulfide) is effected at a temperature somewhat higher than the glass transition point (Tg). It is necessary to control the temperature conditions strictly to an extremely narrow range in order to obtain a good uniform film. Especially, the stable production of thin films is difficult without such a strict temperature control. The incorporation of a styrene-based resin in the poly(arylene sulfide) can however improve the film-forming properties of the latter resin, so that the temperature range of longitudinal stretching, which requires a strict control in sequential biaxial stretching, can be broadened than that required usually. In addition, the above incorporation facilitates the release of a film from rolls. Such features have extremely important significance for stably obtaining a film whose properties are uniform along the length thereof. In the case of stretching of a film made of a usual poly(arylene sulfide) which is free of any polystyrene-based resin, the release of the film from the stretching rolls is unstable especially where the thickness of the film is small (this problem is called "stick-slip phenomenon" by those skilled in the art). In some instances, this unstableness may be solved by controlling the stretching temperature, draw ratio, atmosphere temperature and the like with extreme accuracy. It may however not be solved in some other instances no matter how strict the control is. Such unstableness leads to lack of uniformity in the state of orientation of the film after its stretching. In addition, the film may be torn or whitened in the subsequent steps, namely, the transverse stretching step and thermal setting step. In practice, this means that the running properties are impaired. However, the above-mentioned stick-slip phenomenon is actually reduced significantly when the styrene-based resin is blended. As a result, the film-forming properties are improved.

Biaxially-stretched film made of a poly(arylene sulfide)-based resin:

The biaxially-stretched film according to the present invention retains the good heat resistance and dimensional stability of the poly(arylene sulfide) and at the same time, has preferable surface roughness and high lubricity. These preferable features have probably been brought about for the following reasons. Namely, both resins do not appear to be dissolved completely in each other but the styrene-based resin seems to be dispersed in the poly(arylene sulfide). Moreover, the styrene-based resin is perhaps dispersed in particles much smaller than expected, so that suitable roughness is imparted to the surfaces of the film. The good dispersion of the styrene-based resin is also appreciated from the fact that preferable surface roughness has been obtained in spite of rather small proportions of the styrene-based resin. As is apparent from the high dielectric strength (dielectric breakdown strength) of the biaxially-stretched film of the present invention, the dielectric strength characteristics of a poly(arylene sulfide) film have been retained at high levels simply but have been improved further.

The high lubricity and excellent dielectric strength characteristics of the biaxially-stretched film of the present invention will next be described specifically with reference to certain physical data and their measurement methods.

The surface characteristics of a film may be specified by the degree of fine ruggedness (surface roughness) and the coefficient of dynamic friction. It is preferable that the surface roughness is small, the planarity is excellent, the coefficient of dynamic friction is small and the lubricity is high.

Surface roughness

The measurement of the roughness of a film surface (surface roughness) is generally conducted by means of a surface roughness tracer. In the present invention, each surface roughness is a value measured by "SURFCOM A-550", which has been manufactured by Tokyo Seimitsu Co., Ltd., in accordance with the measurement method prescribed in JIS B-0601 for the average roughness along the center line, Ra (μm).

A roughness curve of a film is defined by a surface contour of the film, which appears in a cross-section obtained upon cutting the film along a plane perpendicular to its average surfaces. A center line is drawn along the average surfaces of the cross-section.

When a section is taken out from a roughness curve over a measurement length l in the direction of its center line, the center line of the thus-taken section and the direction of the longitudinal expansion ratio are arranged along X-axis and Y-axis respectively, and the roughness curve is expressed by $y = f(x)$, the average roughness along the center line, Ra is represented by a value determined in accordance with the following equation and expressed in terms of μm.

$$Ra = \frac{1}{l} \int_0^l |f(x)| dx$$

Upon measurement of Ra (hereinafter expressed as the surface roughness), l was set at 0.25 mm. Using a needle having a curvature of radius of 2 μm at a tip portion thereof, each surface was scanned under a load of 0.4 g. The roughness was measured at 50,000-fold sensitivity.

The biaxially-stretched film of the present invention has a surface roughness (Ra) of 0.50 μm or smaller, preferably, 0.02–0.50 μm and is hence excellent in planarity. If the surface roughness (Ra) exceeds 0.50 μm, the coefficient of dynamic friction becomes smaller but the ruggedness becomes greater, thereby failing to provide a film suitable for use as a photographic base film, magnetic tape base film or the like. If the surface roughness (Ra) is unduly small, the coefficient of dynamic friction tends to become greater so that difficulties are encountered upon handling the film in the production process of a capacitor element, during which the film is repeatedly taken up and rewound. Even when formed into a final product, for example, a base film for magnetic tapes, the base film is accompanied by a inconvenience that the resulting tapes would be stretched due to the poor slide properties of the film.

Coefficient of dynamic friction

Each coefficient of dynamic friction was determined in accordance with ASTM-D1894, namely, by allowing the film to stand for 40 hours in a room whose atmosphere was controlled at 50% R.H. and 23° C. and then measuring it by a friction meter "Model TR", which had been manufactured by Toyo Seiki Seisakusho, Ltd., at an interfilm contact area of 63.5 mm × 63.5 mm under a load of 200 g at a pulling speed of 150 mm/min in the same room.

The coefficient of dynamic friction of the biaxially-stretched film according to this invention may be 0.9 or smaller, preferably, 0.7 or smaller. If the coefficient of dynamic friction exceeds 0.9, the film may be wrinkled or folded, or where its thickness is small, may become susceptible of being cut off upon when it is taken up. Such a large coefficient of dynamic friction is therefore not preferred.

Dielectric strength

The dielectric strength of each film was measured in accordance with JIS C2318, namely, by applying a d.c. voltage to the film at room temperature (24° C.) and an electrode diameter of 25 mm in air. As its dielectric strength datum, the average of 40 values measured was used.

A film having high dielectric strength permits application of a high voltage, but a film having low dielectric strength is broken at a low voltage. Accordingly, the dielectric strength of a film can serve an important index or standard for the evaluation of physical properties of the film as a capacitor film. Since a thinner film can be used as its dielectric strength increases, a film having high dielectric strength can be fabricated into a capacitor element having a large capacitance in spite of its small size.

Dielectric strength varies depending on film thickness even under the same measurement conditions. In a relatively thin thickness range, the value of dielectric strength tends to become smaller as the thickness decreases.

The biaxially-stretched film according to this invention shows a dielectric strength level as high as about 260–400 (V/μm) within a film thickness range of from about 4 μm to about 10 μm, and its dielectric strength tends to become higher as the film thickness increases.

As has been described above, biaxially stretched films according to the present invention have been imparted with high lublicity without lowering the dielectric strength characteristics of poly(arylene sulfide) films. They are hence useful for a wide variety of applications, for example, led by capacitor films and including flexible printed circuit boards, films for magnetic tapes, electrical insulating materials for motors and transformers, ribbons for thermal transfer printers, etc.

EMBODIMENTS OF THE INVENTION

The present invention will hereinafter be described specifically by the following Examples and Comparative Examples. Needless to say, the present invention is not limited only to the following Examples. All designations of "part" and "parts" will mean part or parts by weight unless otherwise specifically indicated.

EXAMPLE 1 & COMPARATIVE EXAMPLES 1–2

Ten parts of a polystyrene-based resin ("Toporex HI860", trade name; product of Mitsui-Toatsu Chemicals, Inc.; melt index: 3.0) were blended with 100 parts of poly(p-phenylene sulfide) powder (product of Kureha Chemical Industry Co., Ltd.; melt viscosity : 6,800 poises; non-Newtonian coefficient, n: 1.30). They were kneaded at 310° C. in an extruder, followed by pelletization. The resultant pellets were molten and extruded, thereby forming an unoriented sheet.

After preheating the sheet with metal rolls whose surface temperature was controlled at about 60° C., the sheet was subjected to inter-roll stretching at a draw ratio of 3.3 times on ceramic rolls controlled at 97° C. The sheet was then introduced into a tenter, in which it was stretched by 3.3 times in the transverse direction by means of a tenter stretching machine in a hot air atmosphere controlled at 96° C. After the transverse stretching, the sheet was immediately fed via a buffer zone to a thermal setting zone in which it was thermally set at a hot air temperature of 265° C. At that time, the percent relaxation in the transverse direction was 5%. The film thickness was 8 μm.

For the sake of comparison, using the same poly(p-phenylene sulfide), a film free of any additive (Comparative Example 1) and a film added with 0.3 part of fine powder (average particle size: 0.7 μm) of calcium carbonate as an inorganic filler (Comparative Example 2) were separately formed in the same manner as in Example 1.

Their surface roughness, coefficients of dynamic friction, dielectric strength and running properties upon film formation were then measured. Results are summarized in Table 1.

Incidentally, the surface roughness Ra (μm), coefficients of dynamic friction and dielectric strength (V/μm) were measured respectively by the measurement methods described above.

TABLE 1

|  | Comp. Ex. 1 No additive | Comp. Ex. 2 Added with calcium carbonate | Example 1 Added with styrene-based resin |
| --- | --- | --- | --- |
| Film thickness (μm) | 8 | 8 | 8 |
| Surface roughness (μm) | 0.004 | 0.010 | 0.023 |
| Coefficient of dynamic friction | >>1 | 0.45 | 0.40 |
| Dielectric strength (V/μm) | 290 | 200 | 360 |
| Running properties of film upon its formation | A little poor | A little poor | Extremely good |

The "running properties of film upon its formation" in the bottom row of Table 1 indicates the tendency of tearing of each film inside the tenter (stretching and thermal setting zones) in the course of its production. "A little poor" indicates that tearing took place once or twice per hour upon continuous formation of the film, while "extremely good" indicates that absolutely no tearing occurred.

The film containing the styrene-based resin had better dielectric strength even compared to the film free of any additive and its surfaces were roughened to have sufficient lubricity. When employed as a capacitor film by way of example, the films of Comparative Examples 1 and 2 were practically unusable or inferior in physical properties but the invention film of Example 1 was extremely suitable.

EXAMPLE 2

The surface roughness of biaxially-stretched films obtained by changing the proportion of the styrene-based resin relative to the poly(p-phenylene sulfide) in Example 1 are shown diagrammatically in FIG. 1. Where the proportion of the styrene-based resin per 100 parts of the poly(p-phenylene sulfide) was 10 parts (namely, 10 PHR) and 25 parts, their surface roughness [FIG. 1(a)] were values measured respectively on films obtained by merely melting, blending and pelletizing powders of both resins and then forming the pellets. Where the proportion was 3 parts and 5 parts, their surface roughness [FIG. 1(b)] were values measured respectively on films obtained by using as a master batch a resin composition blended in a molten state with 10 PHR of the styrene-based resin, diluting the master batch with the poly(p-phenylene sulfide), forming the resultant resin compositions into pellets and then forming the pellets. As is apparent from FIG. 1, it is understood that higher surface roughness can be obtained even with a smaller amount of a styrene-based resin when a master batch is prepared in advance and is then diluted.

EXAMPLE 3 & COMPARATIVE EXAMPLES 3–6

The dielectric strength of films obtained with various film thicknesses in accordance with the same composition as in Example 1 by a film-forming method similar to that employed in Example 1 were measured.

For the sake of comparison, biaxially-stretched films of various thicknesses were formed separately from poly(p-phenylene sulfide) (PPS) free of any additive, MPS [a block copolymer of poly(m-phenylene sulfide) and poly(p-phenylene sulfide)] free of any additive, PPS added with 0.3 part of kaolin (average particle size: 0.3 μm) and PPS added with 0.3 part calcium carbonate and their dielectric strength were then measured similarly.

Incidentally, MPS was prepared in accordance with the production process described in Japanese Patent Laid-Open No. 14228/1986. Specifically, it was a block polymer obtained by polymerizing a m-phenylene sulfide prepolymer, which had been polymerized in advance and had a polymerization degree of about 30 as measured by the GPC method, with p-dichlorobenzene and sodium sulfide ($Na_2S$) in the presence of water-containing N-methylpyrrolidone as a solvent. The molar fraction of m-phenylene sulfide recurring units

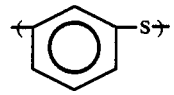

in the block polymer was about 0.15 (by IR analysis). The melt viscosity of the block polymer was 3,700 poises as measured at 310° C. and a shear rate of 200 $sec^{-1}$, while its non-Newtonian coefficient was 1.24.

Figure 2:
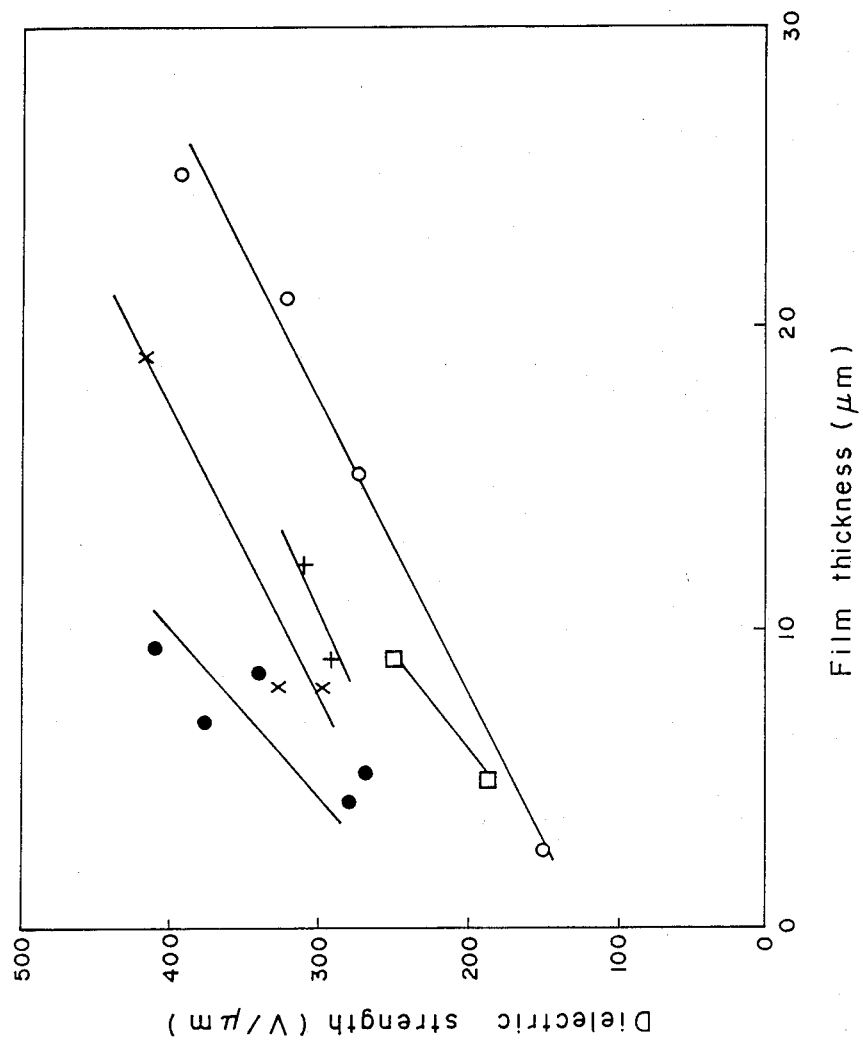
FIG. 2 shows diagrammatically the dielectric strength levels of films according to the present invention and those of Comparative Examples.

Those measurement results are diagrammatically depicted in FIG. 2.

In FIG. 2, the poly(p-phenylene sulfide) (PPS) free of any additive is indicated by mark +, the MPS free of any additive by mark ×, the PPS added with 0.3 part of kaolin by mark □, the PPS added with 0.3 part of calcium carbonate by mark ○ and the PPS added with 10 parts of the styrene-based resin by mark ●.

The dielectric strength (dielectric breakdown strength) of the films are also dependent on their thicknesses. In the films of each type, the dielectric strength increases as the thickness becomes greater. Comparing the various films at the same thickness, the film blended with the styrene-based resin is superior to the films free of any additive and is far superior to the films added respectively with kaolin and calcium carbonate.

What is claimed is:

1. In a biaxially-stretched film made of a poly(arylene sulfide) resin composition, the improvement wherein the composition comprises 100 parts by weight of a substantially linear poly(arylene sulfide) having a melt viscosity of at least 1,000 poises and 10–80 parts by weight of a polystrene resin.

2. The film according to claim 1, wherein the film has a coefficient of dynamic friction of not greater than 0.90 relative to a film of the same type and has a surface roughness Ra (μm) of not greater than 0.50.

3. A high dielectric strength film composed of the film according to claim 1.

4. An electrical insulating film composed of the film according to claim 1.

5. A capacitor film composed of the film according to claim 1.

6. A biaxially-stretched film made of a poly(arylene sulfide) resin composition, comprising 100 parts by weight of a substantially linear poly(arylene sulfide) having a melt viscosity of at least 1,000 poses and 10–80 parts by weight of a polystrene resin, said biaxially-stretched film having a coefficient of dynamic friction of not greater than 0.90 relative to a film of the same type and a surface roughness Ra (μm) of not greater than 0.50.

* * * * *